United States Patent [19]

Umezaki et al.

[11] Patent Number: 4,502,916
[45] Date of Patent: Mar. 5, 1985

[54] PROCESS FOR FORMING FINE PATTERNS

[75] Inventors: Hiroshi Umezaki, Koganei; Naoki Koyama; Yoozi Maruyama, both of Hachioji; Yutaka Sugita, Tokorozawa, all of Japan

[73] Assignee: Hitachi, Ltd., Tokyo, Japan

[21] Appl. No.: 607,000

[22] Filed: May 3, 1984

[30] Foreign Application Priority Data

May 4, 1983 [JP] Japan .................................. 58-77436

[51] Int. Cl.$^3$ ........................ B44C 1/22; C03C 15/00; C03C 25/06; B29C 17/08
[52] U.S. Cl. .................................... 156/643; 156/646; 156/652; 156/655; 156/659.1; 156/667; 156/668; 156/904; 204/192 E
[58] Field of Search ............... 156/643, 646, 652, 653, 156/655, 659.1, 661.1, 668, 667, 904; 252/79.1; 204/164, 192 E; 427/38, 39

[56] References Cited

U.S. PATENT DOCUMENTS

| | | | |
|---|---|---|---|
| 4,132,586 | 1/1979 | Schaible et al. | 156/904 X |
| 4,288,283 | 9/1981 | Umezaki et al. | 156/667 X |
| 4,362,598 | 12/1982 | Griffing | 156/646 X |
| 4,390,394 | 6/1983 | Mathuni et al. | 156/904 X |

OTHER PUBLICATIONS

Solid State Technology, Aug. 1981, pp.74–80, Multilayer Resist Systems for Lithography, M. Hatzakis.
J. Vac. Sci. Technol., 16(6), Nov./Dec. 1979, pp. 1620–1624, High Resolution Steep Profile Resist Patterns, J. M. Moran et al.

Primary Examiner—William A. Powell
Attorney, Agent, or Firm—Antonelli, Terry & Wands

[57] ABSTRACT

Fine patterns are formed by a process wherein a workpiece is spin coated with a heat-resistant resin layer, this resin layer is spin coated with an organotitanium or titanium oxide layer, a resist pattern is formed on the organotitanium or titanium oxide layer, the organotitanium or titanium oxide layer is etched by ion etching with the resist pattern as a mask, and finally, the resin layer is etched by using the etched organotitanium or titanium oxide layer as a mask.

7 Claims, 4 Drawing Figures

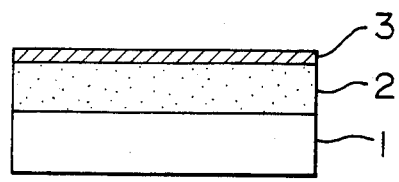
FIG. I(a)
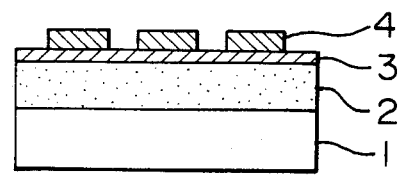
FIG. I(b)
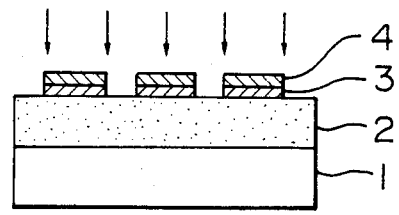
FIG. I(c)
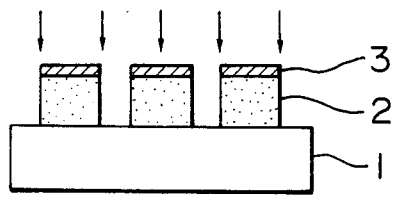
FIG. I(d)

PROCESS FOR FORMING FINE PATTERNS

BACKGROUND OF THE INVENTION

This invention relates to a process for forming fine semiconductor patterns, and more particularly to such a fine pattern forming process which is especially suited for forming patterns with small dimensions around or less than 1 μm.

Hitherto, for forming patterns for magnetic bubble memories and other semiconductor devices, the so-called photoetching technique has been used in which a workpiece is etched through a resist pattern formed thereon. In practice of this photoetching technique, the resist layers are required to have a sufficient thickness to endure during the etching work. For instance, in case a 0.35 μm thick NiFe alloy layer is etched by ion milling, a resist thickness of about 0.7 μm is required. On the other hand, the fact is observed that generally the smaller the resist thickness, the higher becomes the resolution of the resist pattern. Making the best use of this fact, a so-called tri-layer resist process has been proposed in which mask patterns for etching are made by using thin resist layers (J. M. Moran et al: J. Vac. Sci. Technol., 16(6), 1620–1624 (1979)). According to this process, a resin layer is first formed on a workpiece, then an inorganic intermediate layer is formed on said resin layer and a resist pattern is formed on said inorganic layer. The inorganic layer is etched with the resist pattern as a mask, and then the resin layer is etched by, for instance, ion etching using oxygen. In this ion etching, said inorganic layer can act as a mask since this inorganic layer has high durability to ion etching with oxygen. In conducting inorganic layer etching, the resist layers are not required to have a greater thickness than necessary to withstand etching, and usually a small resist thickness on the order of 0.2–0.3 μm is used.

Relating to the inorganic layer, Moran et al proposed an $SiO_2$ layer formed by CVD (chemical vapor deposition) while Endo et al disclosed an Si layer formed by vacuum deposition (see A Collection of Papers Presented at the 28th Conference of the Japan Society of Applied Physics, 1981, p. 370). These proposals, however, have drawbacks in that an evacuating equipment is required and that the working process is prolonged.

To avoid these problems, a method using an $SiO_2$ layer formed by spin coating has been proposed (Matsui et al: A Collection of Papers Presented at the 29th Conference of Japan Society of Applied Physics, 1982, p. 357). According to this method, an $SiO_2$ layer can be obtained by spin coating a monomolecular type organosilicon compound and further applying a heat treatment, and the process is greatly simplified. However, the $SiO_2$ layer obtained from this method is not quite satisfactory in adhesion to the underlying resin layer and the top resist pattern. In case, for instance, a polyimide resin, which is a heat-resistant high polymeric resin, is used for the resin layer, the $SiO_2$ layer formed thereon by said method proves to be liable to cracking and no good layer can be obtained. Also, when a novolac resist AZ-1350-J (Shipley Company) is used as resist, the obtained resist layer is found to be poor in adhesion to the underlying $SiO_2$ layer formed by said method, resulting in separation of the resist pattern. Further, since the monomolecular organosilicon compounds are easily hydrolyzed, a risk is great of the coats being contaminated by alien matters (hydrolyzates).

SUMMARY OF THE INVENTION

The present invention is aimed at solving these problems of the prior art methods and, to this end, it provides a process for forming a fine pattern having good adhesiveness to resist layers and free of any fear of contamination.

The present invention features the use of an organotitanium, an organotantalum as the intermediate layer in said tri-layer resist process. These materials have good adhesiveness to polyimide resins and novolac resists. The organotitanium and organotantalum vary in the rate of hydrolysis depending on the compound types, but there exist those compounds which are very low in the rate of hydrolysis.

In order to attain the said object, the present invention provides a process for forming a fine pattern comprising the steps of forming a resin layer on a workpiece, forming on said resin layer a layer of a titanium compound such as organotitanium or titanium oxide or a tantalum compound, further forming on said layer of a titanium or tantalum compound a resist pattern of a desired configuration, etching said titanium or tantalum compound layer using said resist pattern as a mask, and then etching said resin layer using the resulting titanium or tantalum compound layer as a mask.

BRIEF DESCRIPTION OF THE DRAWINGS

FIGS. 1(a) through 1(d) show a schematic of an embodiment of the fine pattern forming process according to this invention.

DETAILED DESCRIPTION OF THE PREFERRED EMBODIMENTS

Hereinafter, an embodiment of this invention will be explained with reference to the accompanying drawings.

As shown in FIG. 1(a), a layer 2 of a resin, preferably a heat-resistant resin, is formed on a workpiece 1. In this embodiment, a polyimide resin solution is spin coated on the workpiece and then a heat treatment is applied thereon at 350° C. to obtain a 1 μm thick resin layer. The resin layer 2 is then covered with an intermediate layer 3 of organotitanium. The term "organotitanium" is used here to refer to a compound of Ti, C, O, H and such. In this embodiment, ATOLON NTi (Nippon Soda Co., Ltd.) is used as the organotitanium solution, and it is spin coated on the resin layer 2, followed by a heat treatment at 200° C. to obtain a 0.1 μm thick organotitanium layer.

Then, a resist pattern 4 is formed on the intermediate organotitanium layer 3 as shown in FIG. 1(b). Used as resist in this embodiment is RD 2000-N (Hitachi Chemical Co., Ltd.) which is a resist for deep ultraviolet light, and it is subjected to contact exposure using deep ultraviolet light to form a pattern. The resist thickness is 0.25 μm.

Then, the organotitanium is ion etched with a $CF_4$ gas as shown in FIG. 1(c). This organotitanium etching can be done by approximately 5-minute ion etch at an input of 100 W under a vacuum of $5 \times 10^{-3}$ Torr.

Finally, the resin layer is ion etched with oxygen gas as shown in FIG. 1(d), at an input of 100 W under a vacuum of $5 \times 10^{-3}$ Torr. The etching rates of the resin layer (polyimide) and the organotitanium are 1,000 Å/min and 10 Å/min, respectively, which indicates that the organotitanium functions as a mask for ion etching of the resin layer with oxygen gas.

Said sequence of processing steps gives a mask pattern for etching of the workpiece. A practical example of etching using said mask pattern for forming a magnetic bubble memory is described below.

A mask pattern made from an organotitanium and a polyimide layer is formed on a layer of Permalloy in the same way as in the above-described embodiment. Then, the Permalloy is etched by ion milling. The etching rates of said organotitanium, polyimide and Permalloy are 100 Å/min, 250 Å/min and 220 Å/min, respectively, and the time required for etching the 3,500 Å thick Permalloy layer is about 16 minutes. As a result of this ion etch, the organotitanium-polyimide mask pattern presents a situation where the organotitanium has disappeared while the polyimide resin still remained in the pattern. Since this polyimide resin, unlike the ordinary resist materials, has excellent heat resistance and is also chemically stable, it presents no problem on pattern reliability even if it is not removed from the pattern.

While the invention has been described by way of an embodiment using organotitanium as a layer material, the effect of this invention can be attained equally by using organotantalum in place of said organotitanium. These materials can be etched with a $CF_4$ gas, and especially the etching rate in ion etch with oxygen is very low. Also, these materials are very small in hydrolysis rate and chemically stable, so that even if the solution of these materials are retained for a long time, there is no fear of causing contamination of the pattern.

In the embodiment described above, the organotitanium layer, after spin coating, was baked at 200° C. At this baking temperature, the material is still in a state of organic matter. When the baking temperature becomes 400° C., the material is made into an inorganic matter and comes to have a compositional structure close to $TiO_2$. Even if a layer of such $TiO_2$-analogous structure is used, it is possible to conduct the same process as above-described embodiment without damaging the said effect and advantages of the invention.

According to this invention, since the tri-layer resist structure is wholy made up of the spin coated layers as described above, the process can be greatly simplified. Also, the organotitanium, organotantalum used as the intermediate layer has good adhesiveness to the resin, especially polyimide resin used for the underlying (first) layer. Said intermediate layer material also shows good adhesion to the top resist pattern, especially novolac resist, and is very excellent in stability and reproducibility.

What is claimed is:

1. A process for forming fine patterns which comprises
   (a) forming a resin layer on a workpiece;
   (b) forming on said resin layer a layer of a titanium or tantalum compound;
   (c) forming on said titanium or tantalum compound layer a resist pattern having a desired configuration; and
   (d) etching said titanium or tantalum compound layer using said resist pattern as a mask, and
   (e) etching said resin layer using the resulting titanium or tantalum compound layer as a mask.

2. A process according to claim 1, wherein said titanium compound is an organotitanium.

3. A process according to claim 1, wherein said titanium compound is titanium oxide.

4. A process according to claim 1, wherein said resin layer is a layer of a heat-resistant resin.

5. A process according to claim 4, wherein the heat-resistant resin is polyimide.

6. A process according to claim 1, wherein the etching of said titanium or tantalum compound layer is conducted with an ion etching gas containing a $CF_4$ gas.

7. A process according to claim 1, wherein the etching of said resin layer is conducted by ion etch using oxygen gas.

* * * * *